United States Patent
Chen et al.

(10) Patent No.: US 10,199,306 B2
(45) Date of Patent: Feb. 5, 2019

(54) AIR-COOLING HEAT DISSIPATION DEVICE

(71) Applicant: Microjet Technology Co., Ltd., Hsinchu (TW)

(72) Inventors: Shih-Chang Chen, Hsinchu (TW); Jia-Yu Liao, Hsinchu (TW); Jheng-Wei Chen, Hsinchu (TW); Chi-Feng Huang, Hsinchu (TW); Yung-Lung Han, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 0 days.

(21) Appl. No.: 15/893,919

(22) Filed: Feb. 12, 2018

(65) Prior Publication Data

US 2018/0240733 A1 Aug. 23, 2018

(30) Foreign Application Priority Data

Feb. 20, 2017 (TW) .............................. 106105650 A

(51) Int. Cl.
*H01L 23/467* (2006.01)
*G06F 1/20* (2006.01)
*H05K 7/20* (2006.01)

(52) U.S. Cl.
CPC ............ *H01L 23/467* (2013.01); *G06F 1/203* (2013.01); *G06F 1/206* (2013.01); *H05K 7/20127* (2013.01); *H05K 7/20136* (2013.01)

(58) Field of Classification Search
CPC ....... H01L 23/467; G06F 1/203; G06F 1/206; H05K 7/20127; H05K 7/20136
See application file for complete search history.

(56) References Cited

U.S. PATENT DOCUMENTS

| | | | | |
|---|---|---|---|---|
| 5,834,864 A | * | 11/1998 | Hesterman | B82Y 35/00 310/40 MM |
| 2007/0103868 A1 | * | 5/2007 | Yazawa | H01L 23/34 361/699 |
| 2007/0285890 A1 | * | 12/2007 | Tsao | H01L 23/467 361/697 |
| 2009/0284918 A1 | * | 11/2009 | Chou | G06F 1/182 361/695 |

(Continued)

*Primary Examiner* — David M Sinclair
*Assistant Examiner* — Robert D Brown
(74) *Attorney, Agent, or Firm* — Birch, Stewart, Kolasch & Birch, LLP

(57) ABSTRACT

An air-cooling heat dissipation device includes a guiding carrier and a gas pump. The guiding carrier includes a pump-receiving recess, a first guiding chamber, a second guiding chamber, a communication structure and at least one discharge groove. The first guiding chamber is concavely formed in the pump-receiving recess, and is in communication with the first guiding chamber. The communication structure is communicating between the first guiding chamber and the second guiding chamber, while the electronic component is disposed within the second guiding chamber. The gas pump is disposed within the pump-receiving recess. When the gas pump is enabled, an ambient gas is driven to sequentially flow through the first guiding chamber, the communication structure and the second guiding chamber to remove the heat from the electronic component. Since the discharge groove is communicating between the second guiding chamber and exterior surroundings, the heated gas is outputted from the discharge groove.

13 Claims, 13 Drawing Sheets

(56) References Cited

U.S. PATENT DOCUMENTS

| | | | |
|---|---|---|---|
| 2011/0002102 A1* | 1/2011 | Brok | H01L 23/467 |
| | | | 361/701 |
| 2012/0085949 A1* | 4/2012 | Chen | F04B 43/043 |
| | | | 251/129.01 |
| 2014/0374896 A1* | 12/2014 | Nishida | H01L 21/4882 |
| | | | 257/712 |
| 2016/0076530 A1* | 3/2016 | Chen | F04B 45/047 |
| | | | 417/413.2 |
| 2017/0222123 A1* | 8/2017 | Chen | H01L 41/09 |
| 2017/0222125 A1* | 8/2017 | Chen | F04B 45/047 |
| 2018/0146544 A1* | 5/2018 | Chen | H05K 7/20154 |
| 2018/0168066 A1* | 6/2018 | Xu | F04B 45/047 |
| 2018/0240734 A1* | 8/2018 | Liao | H01L 23/467 |

* cited by examiner

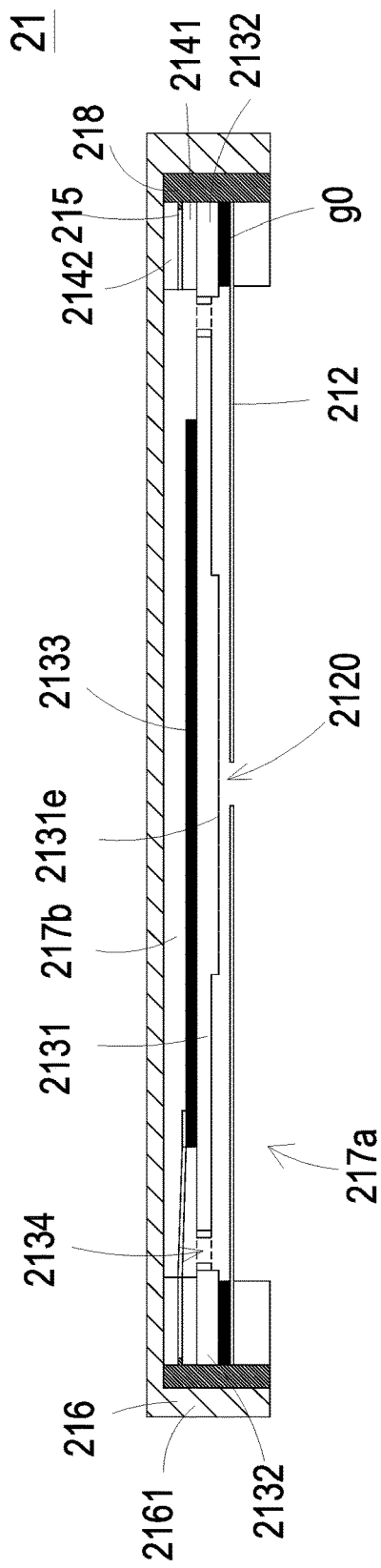
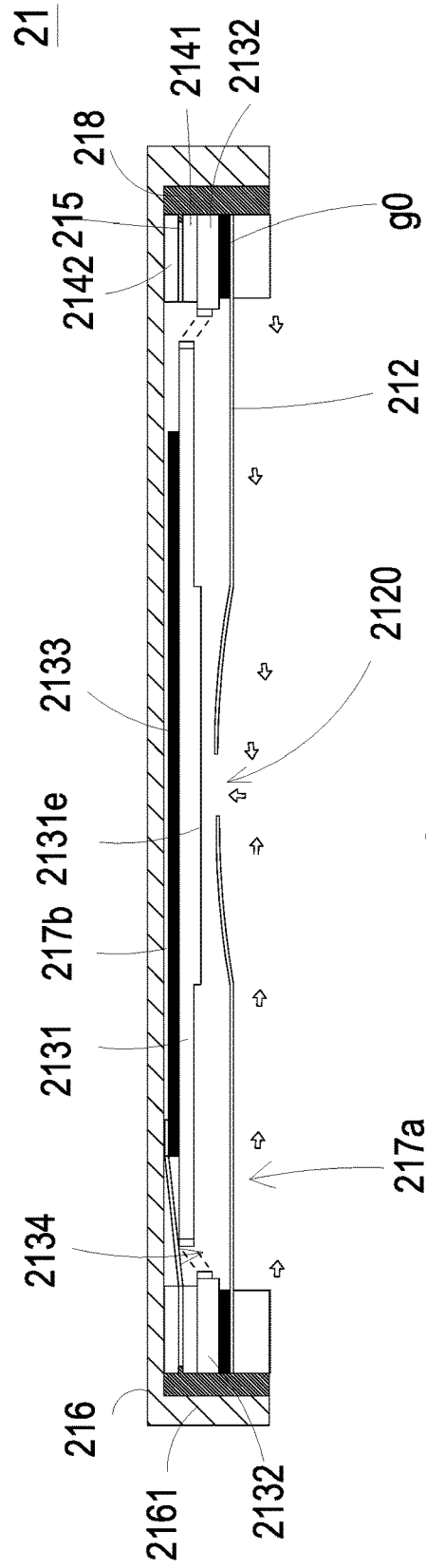

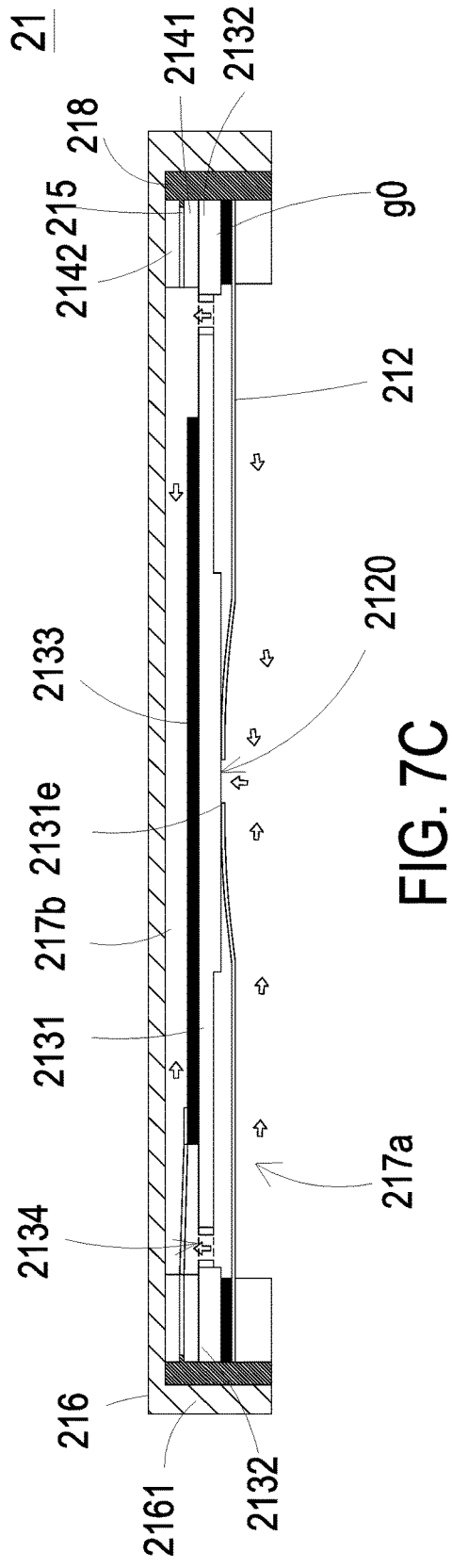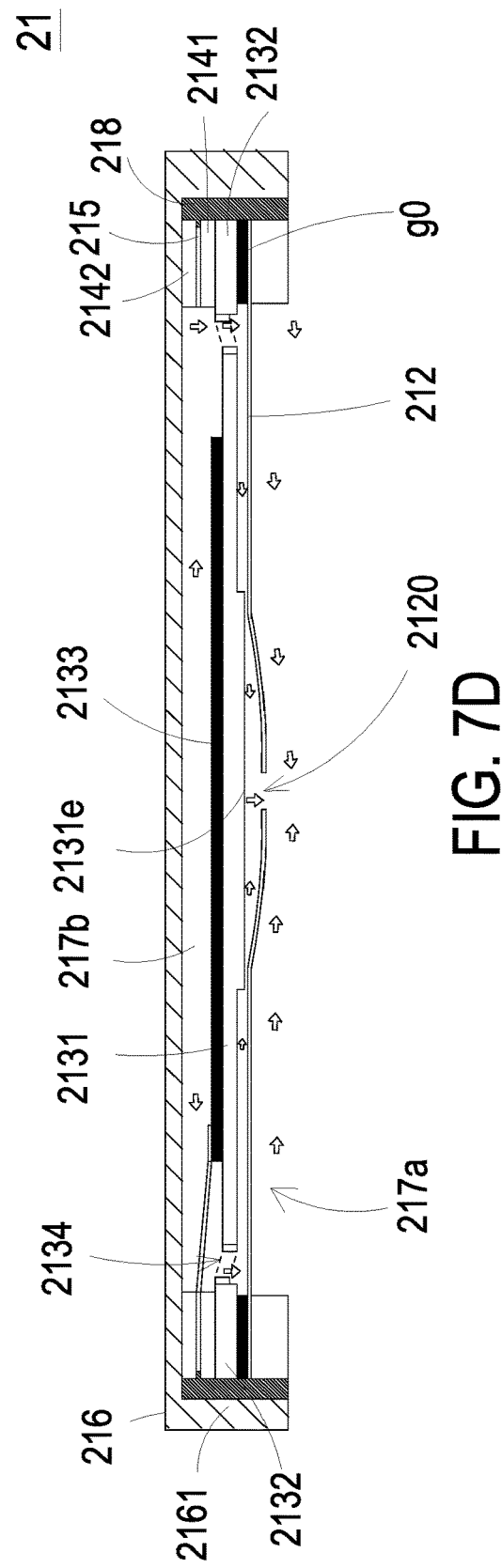
FIG. 7C
FIG. 7D

A  R-COOLING HEAT DISSIPATION DEVICE

AIR-COOLING HEAT DISSIPATION DEVICE

FIELD OF THE INVENTION

The present invention relates to an air-cooling heat dissipation device, and more particularly to an air-cooling heat dissipation device using a gas pump to drive gas to remove heat.

BACKGROUND OF THE INVENTION

With increasing development of science and technology, the trends of designing electronic devices such as portable computers, tablet computers, industrial computers, portable communication devices or video players are designed toward minimization, easy portability and high performance. Generally, the limited space inside the electronic device is equipped with various high-integration or high-power electronic components for increasing the computing speed and the function of the electronic device, thus generating a great deal of heat during operations. Consequently, the temperature inside the device is increased and high temperature is harmful to the components. Since the electronic device is usually designed as possible as in slim, flat and succinct appearance, it has insufficient inner space for dissipating the waste heat. In case that the heat is not effectively dissipated away, the electronic components of the electronic device are adversely affected by the heat and the high temperature may result in the interference of operation or damaged of the device.

Generally, there are two types of the heat-dissipating mechanisms used in the electronic device to solve such problem, which are known as active heat-dissipating mechanism and passive heat-dissipating mechanism. The active heat-dissipating mechanism is usually presented as an axial fan or a blower and disposed within the electronic device, which can generate an air flow through the space inside the electronic device that dissipating the waste heat. However, the axial fan and the blower are noisy during operation. In addition, they are bulky and have short life span and not suitable to be used in the small-sized, portable electronic device.

On the other hand, electronic components are generally fixed on a printed circuit board (PCB) by means of surface mount technology (SMT) or selective soldering technology. The electronic components would readily come off from the PCB board due to exposure of high temperature. Moreover, most electronic components would be damaged by high temperature. In other words, high temperature not only impairs the stability of performance of the electronic components, but also shortens the life span of the electronic components.

FIG. 1 is a schematic view illustrating a conventional heat-dissipating mechanism as the passive heat-dissipating mechanism. As shown in FIG. 1, the conventional heat-dissipating mechanism 1 provides a thermal conduction plate 12 attaching on a surface of an electronic component 11 by thermal adhesive 13. Therefore, the thermal adhesive 13 and the thermal conduction plate 12 form a thermal conduction path by which the waste heat generated by the electronic component 11 can be conducted away and then dissipated by convection. However, the heat dissipating efficiency of the conventional heat-dissipating mechanism 1 is usually insufficient, and thus the applications of the conventional heat-dissipating mechanism 1 are limited.

Therefore, there is a need of providing an air-cooling heat dissipation device in order to overcome the drawbacks of the conventional technologies.

SUMMARY OF THE INVENTION

An object of the present invention provides an air-cooling heat dissipation device. The air-cooling heat dissipation device is applied to an electronic device to remove heat from electronic components of the electronic device through lateral convection. The use of the air-cooling heat dissipation device can increase the heat dissipating efficiency and reduce noise. Consequently, the performance of the electronic components of the electronic device is stabilized, and the use lives of the electronic components are extended. Moreover, since it is not necessary to attach a heat sink on the electronic component, the overall thickness of the electronic device is reduced.

Another object of the present invention provides an air-cooling heat dissipation device with a temperature control function. The operations of a gas pump are controlled according to the temperature changes of the electronic components of the electronic device. Consequently, the heat dissipating efficiency is enhanced, and the use life of the air-cooling heat dissipation device is extended.

In accordance with an aspect of the present invention, there is provided an air-cooling heat dissipation device for removing heat from an electronic component. The air-cooling heat dissipation device includes a guiding carrier and a gas pump. The guiding carrier includes a first surface, a second surface, a pump-receiving recess, a first guiding chamber, a second guiding chamber, an introduction opening, a communication structure and at least one discharge groove. The first surface is a top surface of the guiding carrier. The second surface is a bottom surface of the guiding carrier. The pump-receiving recess is concavely formed in the first surface. The first guiding chamber is concavely formed in a bottom surface of the pump-receiving recess. The introduction opening is formed in the bottom surface of the pump-receiving recess and in communication with the first guiding chamber. The second guiding chamber is concavely formed in the second surface. The communication structure is in communication between the first guiding chamber and the second guiding chamber. The at least one discharge groove is in communication with the second guiding chamber and surroundings of the air-cooling heat dissipation device. The electronic component is disposed within the second guiding chamber. The gas pump is disposed within the pump-receiving recess of the guiding carrier and seals the edge of the introduction opening. The gas pump includes a resonance plate, a piezoelectric actuator and a covering member. The resonance plate has a central aperture. The piezoelectric actuator is aligned with the resonance plate. The covering member includes a sidewall, a bottom plate and an opening. The sidewall is protruded from edges of the bottom plate. An accommodation space is defined by the sidewall and the bottom plate collaboratively to receive the resonance plate and the piezoelectric actuator. A first chamber is formed between the bottom plate of the covering member and the resonance plate. A convergence chamber is formed between the resonance plate and the sidewall of the covering member. When the gas pump is enabled, an ambient gas is introduced into the first guiding chamber through the introduction opening and transferred to the second guiding chamber through the communication structure so as to remove the heat from the electronic component, the gas heated by the electronic component is discharged through the at least one discharge groove.

The above contents of the present invention will become more readily apparent to those ordinarily skilled in the art after reviewing the following detailed description and accompanying drawings, in which:

BRIEF DESCRIPTION OF THE DRAWINGS

FIGS. 7A to 7D schematically illustrate the actions of the gas pump according to the embodiment of the present invention.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
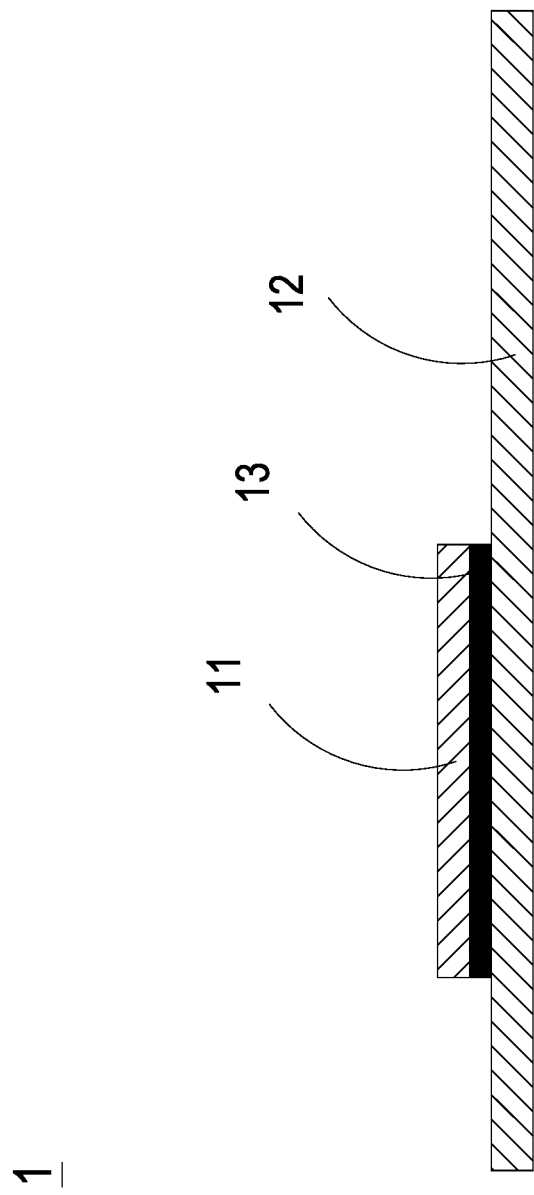
FIG. 1 is a schematic view illustrating a conventional heat-dissipating mechanism.
Figure 2A:
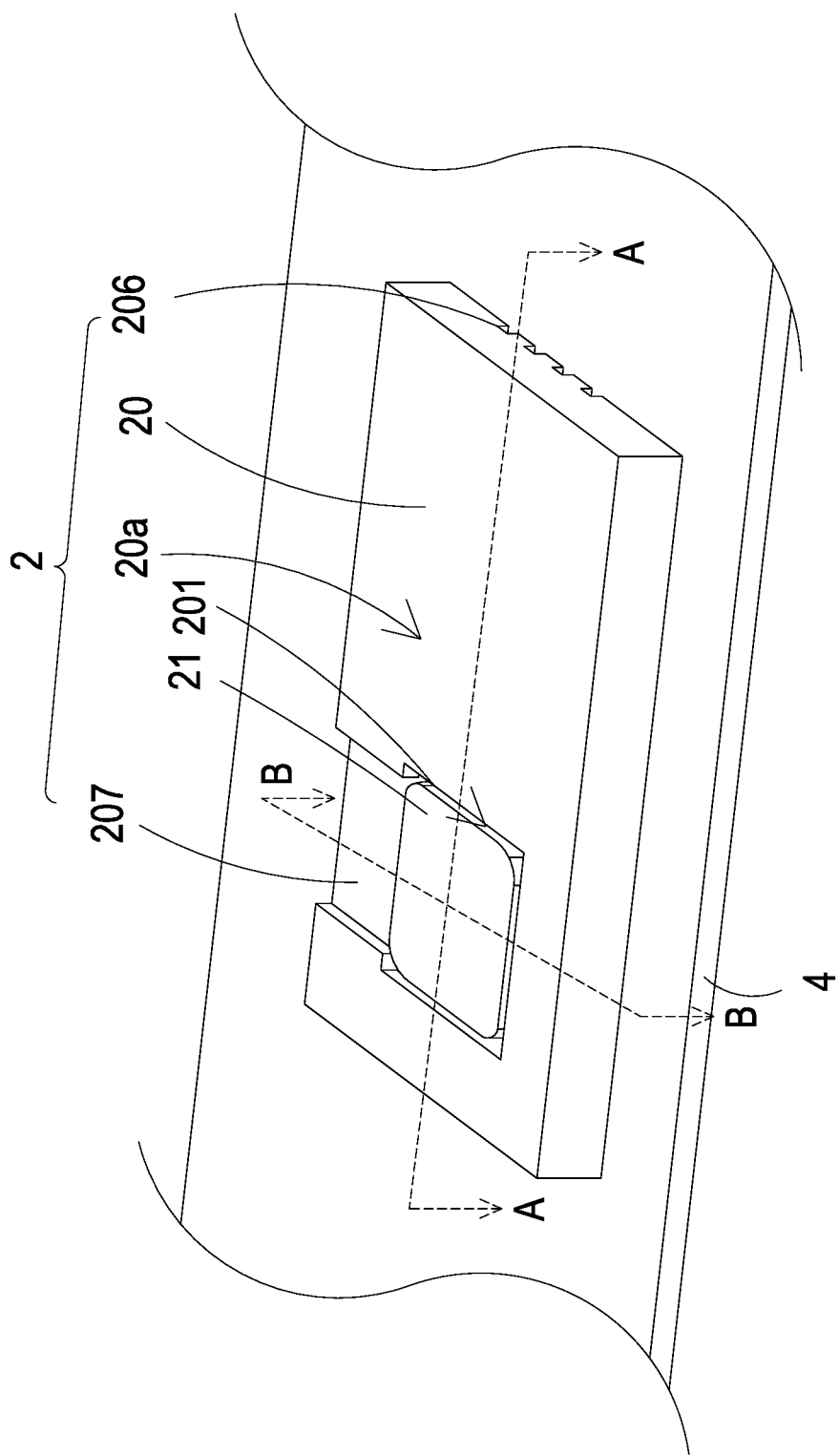
FIG. 2A is a schematic perspective view illustrating the structure of an air-cooling heat dissipation device according to an embodiment of the present invention.
Figure 2B:
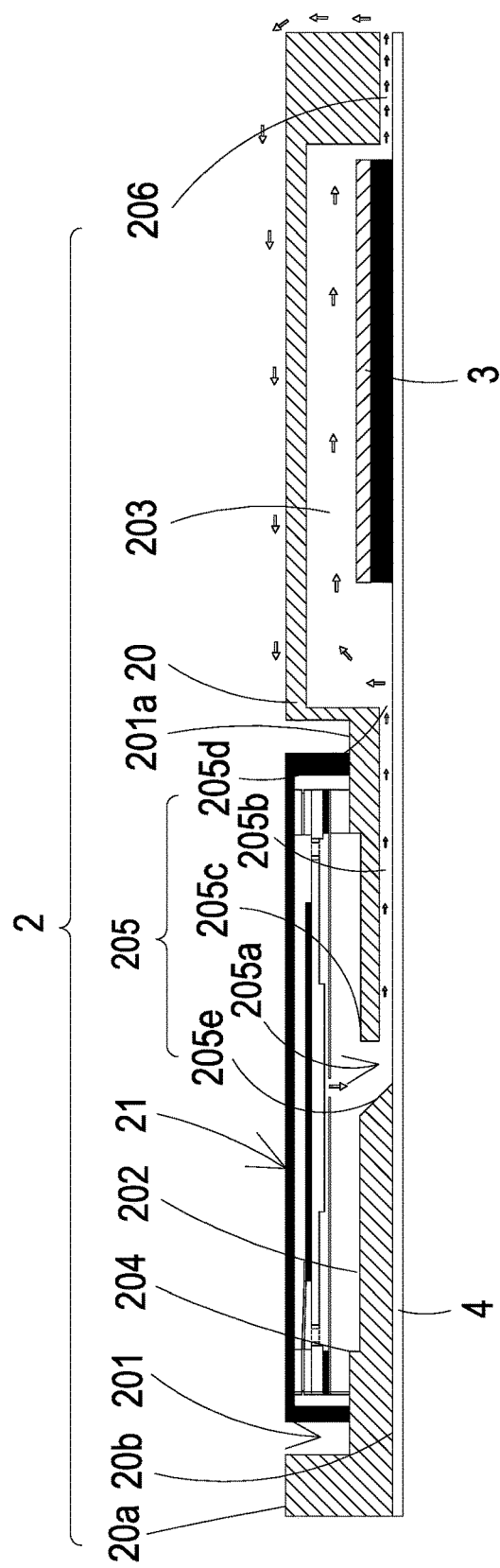
FIG. 2B is a schematic cross-sectional view illustrating the air-cooling heat dissipation device of FIG. 2A and taken along the line AA.
Figure 3A:
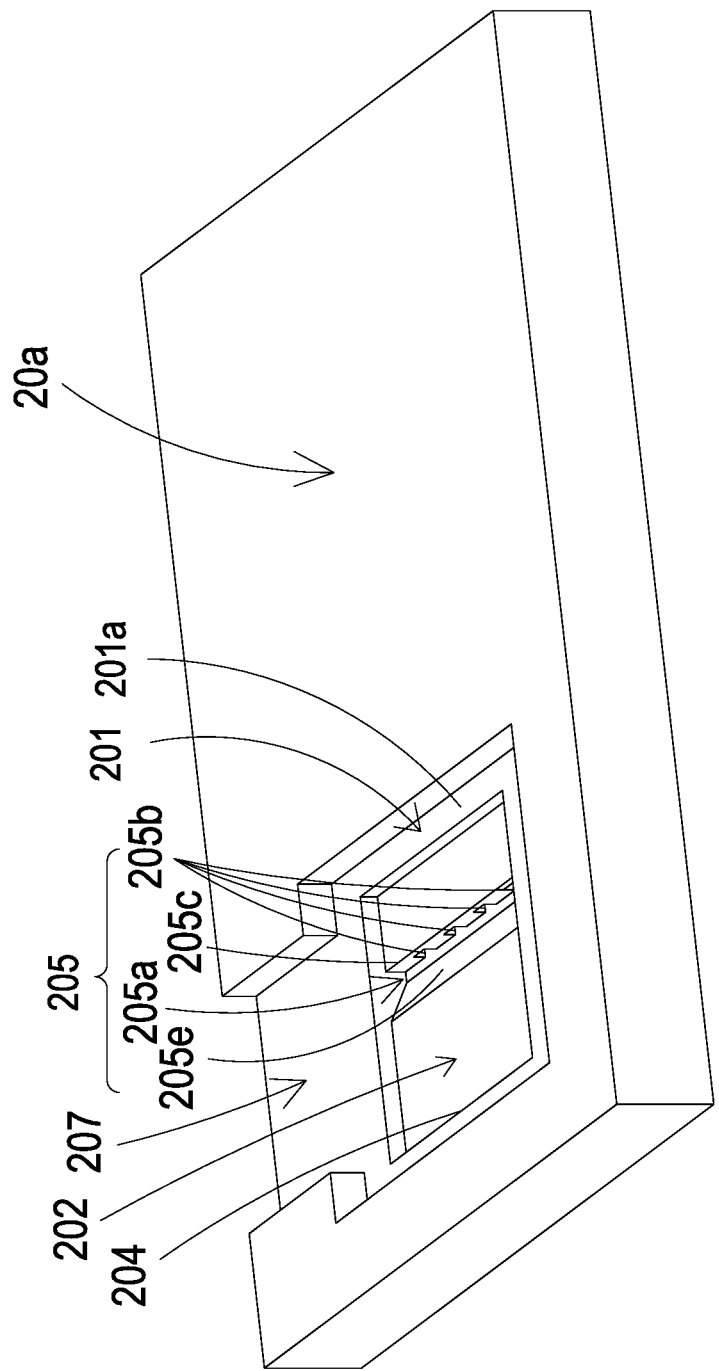
FIG. 3A is a schematic perspective view illustrating a guiding carrier of the air-cooling heat dissipation device as shown in FIG. 2A, in which the gas pump is not shown.
Figure 3B:
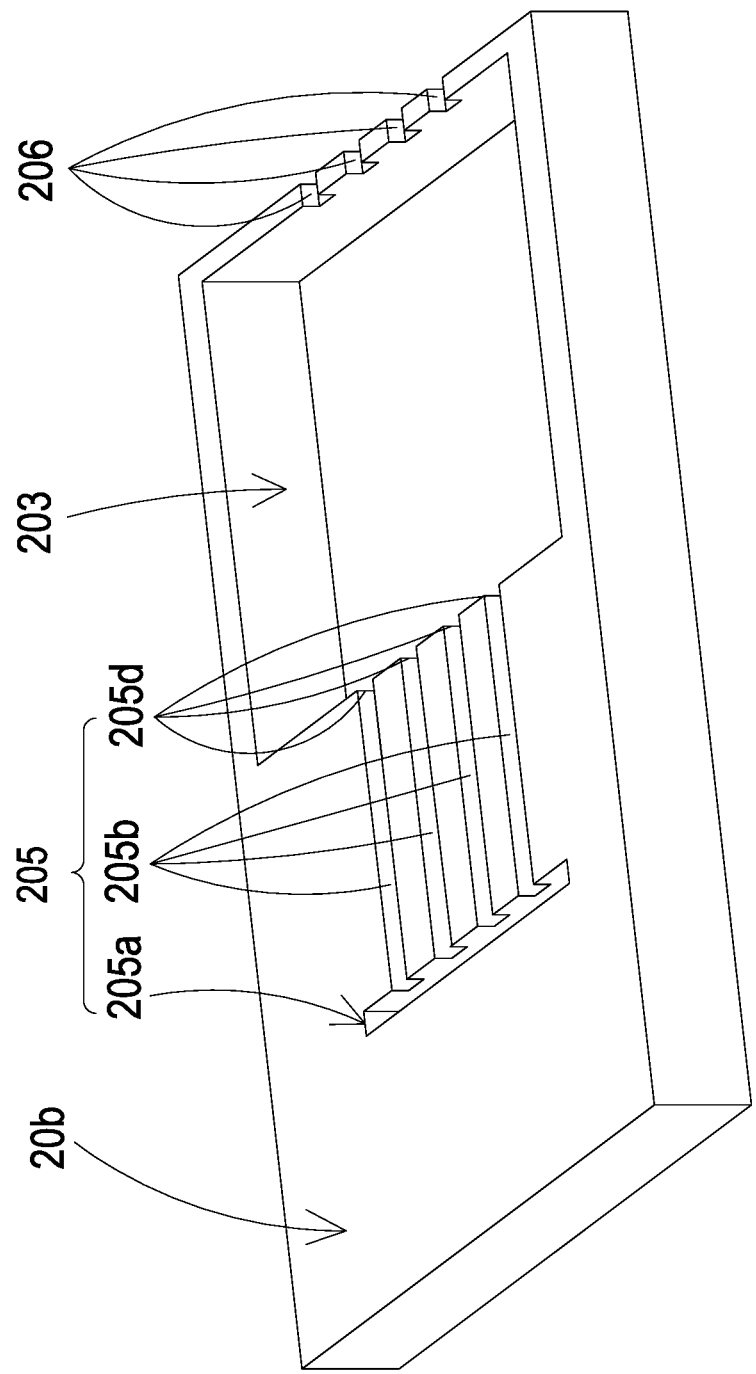
FIG. 3B is a schematic perspective view illustrating the guiding carrier of FIG. 2A and taken along the bottom side.

Please refer to FIGS. 2A, 2B, 3A and 3B. FIG. 2A is a schematic perspective view illustrating the structure of an air-cooling heat dissipation device according to an embodiment of the present invention. FIG. 2B is a schematic cross-sectional view illustrating the air-cooling heat dissipation device of FIG. 2A and taken along the line AA. FIG. 3A is a schematic perspective view illustrating a guiding carrier of the air-cooling heat dissipation device as shown in FIG. 2A, in which the gas pump is not shown. FIG. 3B is a schematic perspective view illustrating the guiding carrier of FIG. 2A and taken along the bottom side.

The air-cooling heat dissipation device 2 is applied to an electronic device to remove the heat from an electronic component 3 of the electronic device. An example of the electronic device includes but is not limited to a portable computer, tablet computer, an industrial computer, a portable communication device or video player. An example of the electronic component 3 includes but is not limited to an integrated circuit (IC).

As shown in FIGS. 2A, 2B, 3A and 3B, the air-cooling heat dissipation device 2 comprises a guiding carrier 20 and a gas pump 21. The guiding carrier 20 comprises a first surface 20a, a second surface 20b, a pump-receiving recess 201, a first guiding chamber 202, a second guiding chamber 203, an introduction opening 204, a communication structure 205 and at least one discharge groove 206. The first surface 20a and the second surface 20b (see FIG. 3B) are the top surface and the bottom surface of the guiding carrier 20 respectively, which are opposing to each other. The pump-receiving recess 201 is concavely formed in the first surface 20a, whereas the second guiding chamber 203 is concavely formed in the second surface 20b, both of which are preferably but not exclusively to be concave structures. The pump-receiving recess 201 is for accommodating the gas pump 21, and the second guiding chamber 203 is for covering and receiving the electronic component 3. Since the gas pump 21 is accommodated within the pump-receiving recess 201, the overall height of the air-cooling heat dissipation device 2 is reduced. In other words, the air-cooling heat dissipation device 2 is slim.

As shown in FIGS. 2A, 2B, 3A and 3B, the first guiding chamber 202 is also a concave structure, and is concavely formed in a bottom surface 201a of the pump-receiving recess 201. The introduction opening 204 is formed in the bottom surface 201a of the pump-receiving recess 201 and in communication between the first guiding chamber 202 and the pump-receiving recess 201. More specifically, introduction opening 204 is the opening of the first guiding chamber 202 which is formed on the bottom surface 201a of the pump-receiving recess 201. The communication structure 205 is arranged between the first guiding chamber 202 and the second guiding chamber 203 for communicating gas in between. Moreover, the at least one discharge groove 206 is in communication with the second guiding chamber 203 and the exterior surroundings of the air-cooling heat dissipation device 2. The gas in the second guiding chamber 203 can be discharged to the surroundings of the air-cooling heat dissipation device 2 through the at least one discharge groove 206.

As shown in FIGS. 2A, 2B, 3A and 3B, the gas pump 21 is accommodated within the pump-receiving recess 201 of the guiding carrier 20, attaching on the bottom surface 201a of the pump-receiving recess 201 and sealing the edge of the introduction opening 204. When the gas pump 21 is enabled, the ambient gas is introduced into the gas pump 21 through an opening 2163 (shown in FIGS. 4A, 4B and 6A) form on a lateral side of the gas pump 21, and guided to the first guiding chamber 202 through the introduction opening 204, then transferred to the second guiding chamber 203 through the communication structure 205. The gas flowing to the second guiding chamber 203 forms the lateral air flows passing through the electronic component 3 and exchange heat therewith, after which the heated gas is discharged to the surroundings through the at least one discharge groove 206. Consequently, the heat dissipation of the electronic component 3 is achieved. It is noted that numerous modifications and alterations may be made while retaining the teachings of the invention. For example, in another embodiment, the guiding carrier 20 is not equipped with the pump-receiving recess 201. That is, the gas pump 21 is mounted on the first surface 20a of the guiding carrier 20. Under this circumstance, the air-cooling heat dissipation device 2 is also effective to cool the electronic component 3.

In this embodiment, the electronic component 3 is disposed on a supporting substrate 4. Preferably but not exclusively, the supporting substrate 4 is a printed circuit board (PCB). The supporting substrate 4 is connected to the second surface 20b of the guiding carrier 20 to make the electronic component 3 accommodated within the second guiding chamber 203 of the guiding carrier 20.

Please refer to FIGS. 2A and 3A again. The guiding carrier 20 further comprises an introduction groove 207 concavely formed in the first surface 20a of the guiding carrier 20. The introduction groove 207 is in communication with the pump-receiving recess 201, so that the ambient gas can be introduced into the gas pump 21 through the introduction groove 207, which solves the problem that the gas input amount may be restricted by narrow space in between the edges of the pump-receiving recess 201 and the gas pump 21. Moreover, by taking advantage of the pump-receiving recess 201, a conducting element such as an electric wire (not shown) may be disposed thereon, which is electrically connected with the gas pump 21 to transmit electricity thereto. Since the arrangement of the conducting element does not increase the overall height of the air-cooling heat dissipation device 2, the air-cooling heat dissipation device 2 is maintained slim.

Please refer to FIGS. 2B, 3A and 3B. The communication structure 205 of the guiding carrier 20 comprises a collecting part 205a, plural communication parts 205b, a collecting part port 205c and plural communication part ports 205d. The collecting part 205a is in communication with the first guiding chamber 202 through the collecting part port 205c. The plural communication parts 205b are in communication with the second guiding chamber 203 through the plural communication part ports 205d. The collecting part 205a further comprises a slant surface 205e corresponding to the plural communication parts 205b. After the gas pump 21 is enabled to input the gas into the first guiding chamber 202, the gas is transferred from the first guiding chamber 202 to the collecting part 205a of the communication structure 205. Due to the slant surface 205e, the flow of the gas is concentrated and the flowrate of the gas is increased. Then, the gas is introduced into the plural communication parts 205b and transferred to the second guiding chamber 203 through the plural communication part ports 205d. Consequently, the heat from the electronic component 3 is continuously removed by the introduced gas. Moreover, as shown in FIG. 3A, the slant surface 205e of the collecting part 205a makes an bottom area of the collecting part 205a smaller, which makes the area of the collecting part port 205c larger than the area of the bottom of the collecting part 205a. Consequently, the flow of the gas is concentrated, and the flowrate of the gas is increased. Since the convection efficacy of the gas in the second guiding chamber 203 is increased, the efficacy of removing the heat from the electronic component 3 is enhanced.

Figure 4A:
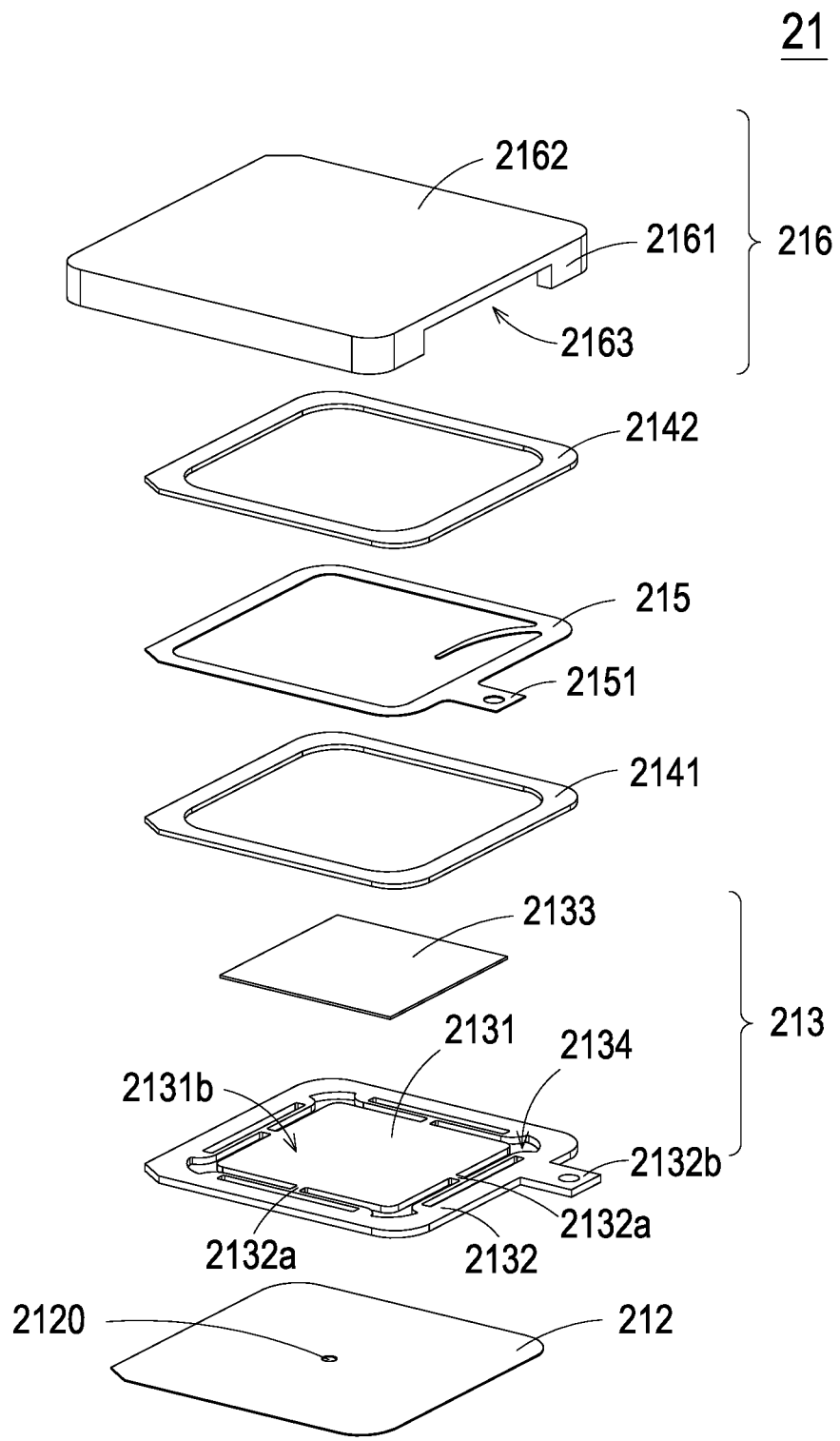
FIG. 4A is a schematic exploded view illustrating a gas pump according to an embodiment of the present invention and taken along a front side.
Figure 4B:
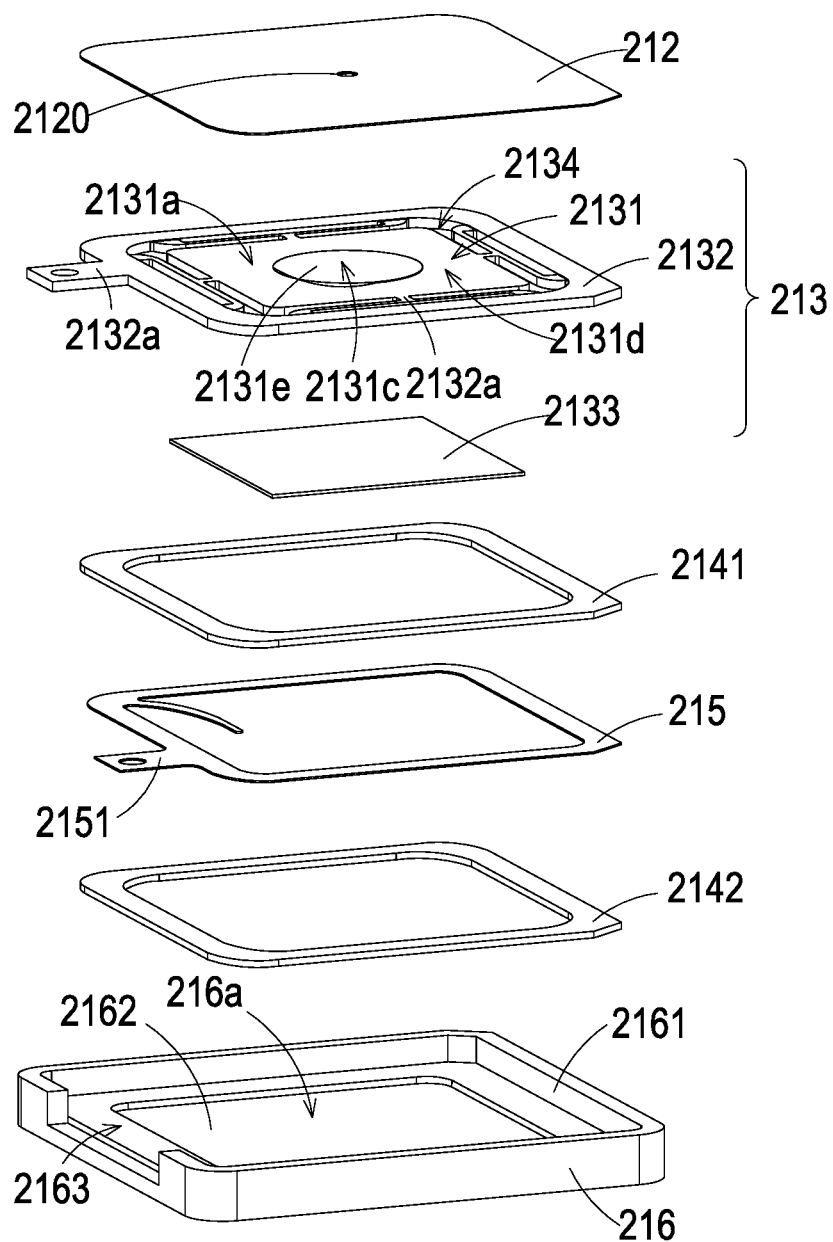
FIG. 4B is a schematic exploded view illustrating the gas pump according to the embodiment of the present invention and taken along a rear side.

Please refer to FIG. 4A and FIG. 4B. FIG. 4A is a schematic exploded view illustrating a gas pump according to an embodiment of the present invention and taken along a front side. FIG. 4B is a schematic exploded view illustrating the gas pump according to the embodiment of the present invention and taken along a rear side. In this embodiment, the gas pump 21 is a piezoelectric gas pump for driving the gas, comprising a resonance plate 212, a piezoelectric actuator 213 and a covering member 216. The resonance plate 212 is aligned with the piezoelectric actuator 213 and has a central aperture 2120 formed in a middle portion of the resonance plate 212. The piezoelectric actuator 213 comprises a suspension plate 2131, an outer frame 2132 and a piezoelectric plate 2133. The suspension plate 2131 comprises a middle portion 2131c and a periphery portion 2131d. When the piezoelectric plate 2133 is applied to a voltage, the suspension plate 2131 is subjected to the curvy vibration from the middle portion 2131c to the periphery portion 2131d, which is driven by the piezoelectric plate 213. The outer frame 2132 is arranged around the suspension plate 2131, including but not limited to at least one bracket 2132a and at least one conducting pin 2132b. The at least one bracket 2132a is connected between the suspension plate 2131 and the outer frame 2132, in which the two ends of the bracket 2132a are connected to the suspension plate 2131 and the outer frame 2132 respectively for elastically supporting the suspension plate 2131. The conducting pin 2132b is protruded outwardly from the outer frame 2132 so as to be electrically connected with an external circuit (not shown). The piezoelectric plate 2133 is attached on a second surface 2131b of the suspension plate 2131. When the piezoelectric plate 2133 is subjected to deformation in response to an applied voltage, the suspension plate 2131 is subjected to a curvy vibration.

The covering member 216 comprises a sidewall 2161, a bottom plate 2162 and an opening 2163. The sidewall 2161 is protruded from the edges of the bottom plate 2162. An accommodation space 216a is defined by the sidewall 2161 and the bottom plate 2162 collaboratively for receiving the resonance plate 212 and the piezoelectric actuator 213. The opening 2163 is formed in the sidewall 2161, so that the conducting pin 2132b of the outer frame 2132 is protruding out of the covering member 216 through the opening 2163 and electrically connected with an external circuit (not shown).

In this embodiment, the gas pump 21 further comprises a first insulation plate 2141, a conducting plate 215 and a second insulation plate 2142, in which the first insulation plate 2141 and the second insulation plate 2142 are respectively disposed on the opposite sides of the conducting plate 215. The shapes of the first insulation plate 2141 and the second insulation plate 2142 substantially match the shape of the outer frame 2132 of the piezoelectric actuator 213. The first insulation plate 2141 and the second insulation plate 2142 are made of an insulating material (e.g. a plastic material) for providing insulating efficacy, whereas the conducting plate 215 is made of an electrically conductive material (e.g. a metallic material) for conducting electricity. The shape of the conducting plate 215 substantially matches the shape of the outer frame 2132 of the piezoelectric actuator 213. Moreover, the conducting plate 215 has a conducting pin 2151 so as to be electrically connected with an external circuit (not shown). Similarly, the conducting pin 2151 is protruded out of the covering member 216 through the opening 2163.

Figure 5A:
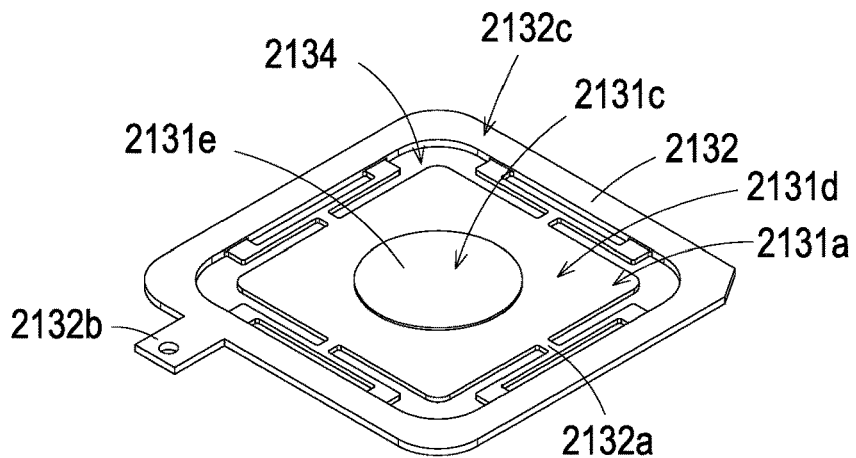
FIG. 5A is a schematic perspective view illustrating the piezoelectric actuator of the gas pump according to the embodiment of the present invention and taken along the front side.
Figure 5B:
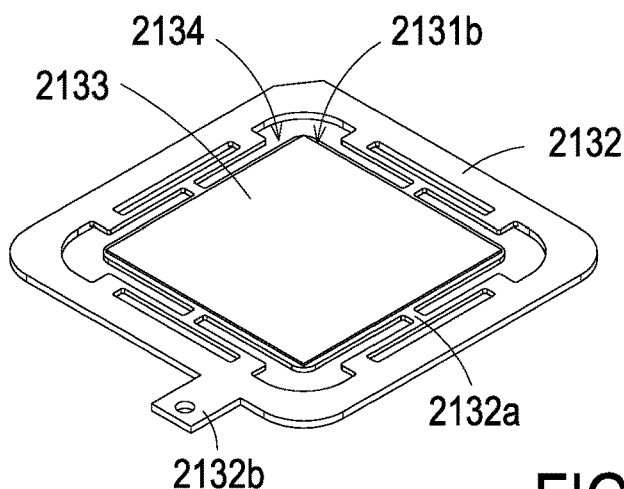
FIG. 5B is a schematic perspective view illustrating the piezoelectric actuator of the gas pump according to the embodiment of the present invention and taken along the rear side.
Figure 5C:
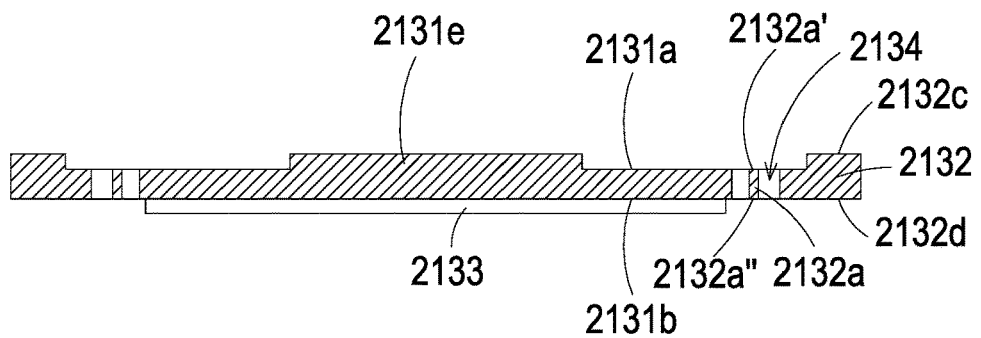
FIG. 5C is a schematic cross-sectional view illustrating the piezoelectric actuator of the gas pump according to the embodiment of the present invention.

Please refer to FIG. 5A, FIG. 5B and FIG. 5C. FIG. 5A is a schematic perspective view illustrating the piezoelectric actuator of the gas pump according to the embodiment of the present invention and taken along the front side. FIG. 5B is a schematic perspective view illustrating the piezoelectric actuator of the gas pump according to the embodiment of the present invention and taken along the rear side. FIG. 5C is a schematic cross-sectional view illustrating the piezoelectric actuator of the gas pump according to the embodiment of the present invention.

In this embodiment, the suspension plate 2131 is a stepped structure. That is, the suspension plate 2131 comprises a bulge 2131e. The bulge 2131e is formed on the first surface 2131a of the suspension plate 2131 and located at the middle portion 2131c. For example, the bulge 2131e is a circular convex structure such as a cylinder. In some other embodiments, the suspension plate 2131 is a plate with two flat side surfaces and has no bulge.

Please refer to FIG. 5C again. A top surface of the bulge 2131e of the suspension plate 2131 is coplanar with a first surface 2132c of the outer frame 2132, and the first surface 2131a of the suspension plate 2131 is coplanar with a first surface 2132a' of the bracket 2132a. Moreover, the bulge 2131e of the suspension plate 2131 (or the first surface 2132c of the outer frame 2132) has a specified thickness with respect to the first surface 2131a of the suspension plate 2131 (or the first surface 2132a' of the bracket 2132a). A second surface 2131b of the suspension plate 2131, a second surface 2132d of the outer frame 2132 and a second surface 2132a'' of the bracket 2132a are coplanar with each other. The piezoelectric plate 2133 is attached on the second surface 2131b of the suspension plate 2131. In some other embodiments, the suspension plate 2131 is a square plate structure with two flat surfaces. That is, the structure of the suspension plate 2131 may be varied according to the practical requirements. In this embodiment, the suspension plate 2131, the outer frame 2132 and the at least bracket 2132a are integrally formed and produced by using a metal plate (e.g., a stainless steel plate). Moreover, at least one vacant space 2134 is formed between the suspension plate 2131, the outer frame 2132 and the bracket 2132a for allowing the gas to go through.

Figure 6A:
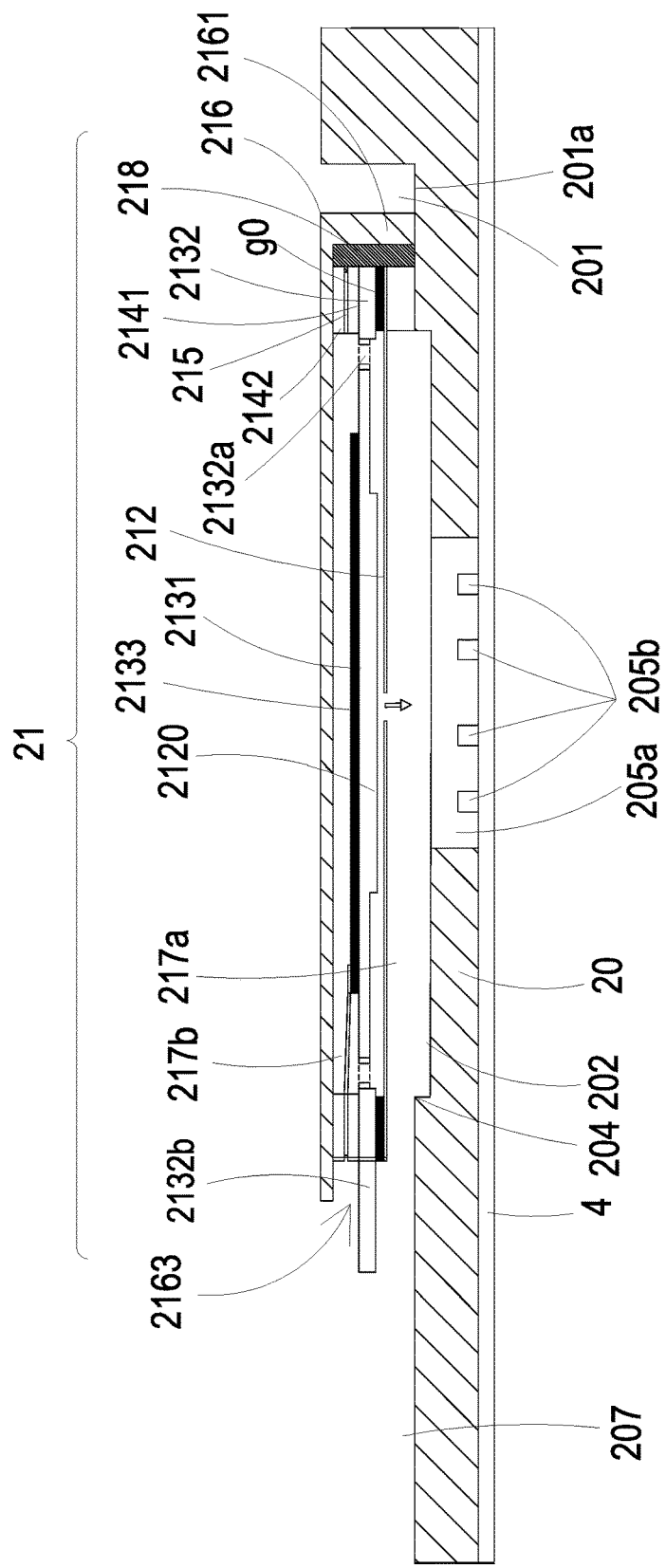
FIG. 6A is a schematic cross-sectional view illustrating the air-cooling heat dissipation device of FIG. 2A and taken along the line B-B.
Figure 6B:
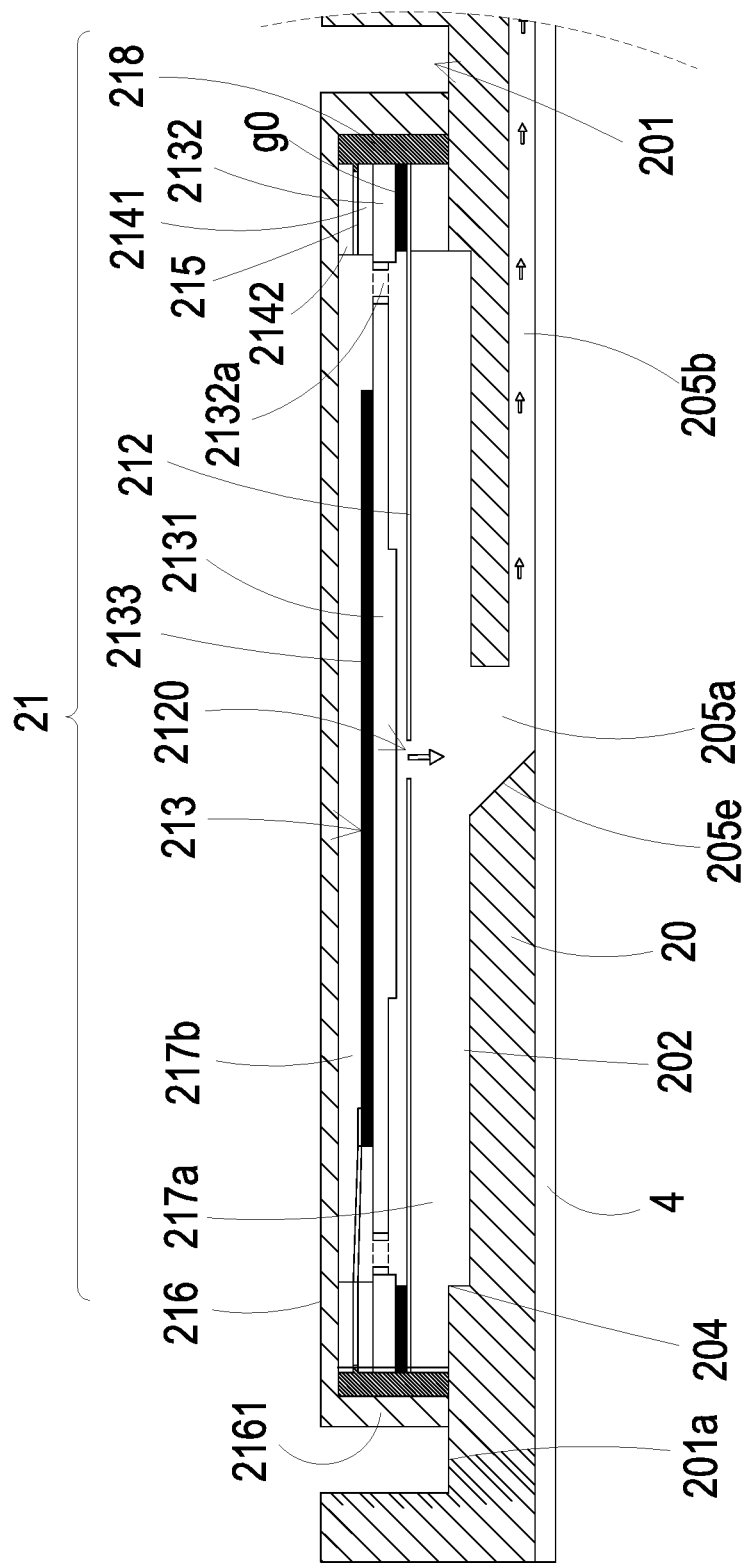
FIG. 6B is a schematic cross-sectional view illustrating a portion of the air-cooling heat dissipation device of FIG. 2B.

Please refer to FIG. 6A and FIG. 6B. The inner structure and the outer structure of the gas pump 21 will be described as follows. FIG. 6A is a schematic cross-sectional view illustrating the air-cooling heat dissipation device of FIG. 2A and taken along the line B-B. FIG. 6B is a schematic cross-sectional view illustrating a portion of the air-cooling heat dissipation device of FIG. 2B. From top to bottom, the covering member 216, the second insulation plate 2142, the conducting plate 215, the first insulation plate 2141, the piezoelectric actuator 213 and the resonance plate 212 of the gas pump 21 are stacked on each other sequentially, wherein the second insulation plate 2142, the conducting plate 215, the first insulation plate 2141, the piezoelectric actuator 213 and the resonance plate 212 have become an assembly, and the periphery of such assembly is coated with glue to form a glue layer 218. The glue layer 218 fills the vacant space in between the assembly and the inner surface of the covering member 216, which is part of the accommodation space 216a. Consequently, the periphery of the assembly is sealed and the gas pump 21 is assembled.

In this embodiment, the gas pump 21 has a square profile. It is noted that the profile of the gas pump 21 may be varied according to the practical requirements. When the gas pump 21 has been assembled, only the conducting pin 2151 (not shown) of the conducting plate 215, and the conducting pin 2132b (see FIG. 6A) of the piezoelectric actuator 213, are protruding out of the covering member 216; and a first chamber 217b is formed between the covering member 216 and the resonance plate 212.

After the gas pump 21 and the guiding carrier 20 are combined together, the sidewall 2161 of the covering member 216 is contacted with the bottom surface 201a of the pump-receiving recess 201 of the guiding carrier 20 to cover the introduction opening 204. Moreover, a convergence chamber 217a is defined by the sidewall 2161 of the covering member 216, the resonance plate 212 and the bottom surface 201a of the pump-receiving recess 201 collaboratively. The convergence chamber 217a is in communication with the exterior surroundings through the opening 2163 of the covering member 216, and the gas pump 21 collects gas from the opening 2163 of the covering member 216.

In this embodiment, there is a gap g0 between the resonance plate 212 and the piezoelectric actuator 213. Moreover, a filler (e.g. a conductive adhesive) is inserted into the gap g0. Consequently, the depth of the gap g0 between the resonance plate 212 and the bulge 2131e of the suspension plate 2131 can be maintained, so as to guide the gas to flow more quickly. Moreover, due to the proper distance between bulge 2131e of the suspension plate 2131 and the resonance plate 212, the contact interference is reduced and the generated noise is largely reduced. In some other embodiments, the height of the outer frame 2312 of the piezoelectric actuator 213 is increased for forming and maintaining the gap between the resonance plate 212 and the piezoelectric actuator 213.

When the piezoelectric actuator 213 is actuated to perform a gas-collecting operation, the gas is introduced into the convergence chamber 217a through the opening 2163 of the covering member 216. Then, the gas is transferred to the first chamber 217b through the central aperture 2120 of the resonance plate 212, and temporarily stored in the first chamber 217b. Oppositely, when the piezoelectric actuator 213 is actuated to perform a gas-releasing operation, the gas is transferred from the first chamber 217b to the convergence chamber 217a through the central aperture 2120 of the resonance plate 212 and transferred to the first guiding chamber 202 through the introduction opening 204.

The operations of the gas pump 21 will be described as follows. FIGS. 7A to 7D schematically illustrate the actions of the gas pump according to the embodiment of the present invention.

Please refer to FIG. 7A, which illustrates an initial state of the gas pump 21 which is not in action. After the covering member 216, the second insulation plate 2142, the conducting plate 215, the first insulation plate 2141, the piezoelectric actuator 213 and the resonance plate 212 of the gas pump 21 are stacked on each other sequentially, the gas pump 21 is assembled. There is a gap g0 between the resonance plate 212 and the piezoelectric actuator 213. The convergence chamber 217a is defined by the sidewall 2161 of the covering member 216, the resonance plate 212 and the bottom surface 201a of the pump-receiving recess 201 collaboratively. The first chamber 217b is formed between the covering member 216 and the resonance plate 212. Meanwhile, the gas pump 21 is not activated.

Please refer to FIG. 7B. When the piezoelectric actuator 213 of the gas pump 21 is actuated, the piezoelectric actuator 213 vibrates upwardly in response to the applied voltage. Consequently, the ambient gas is introduced into the gas pump 21 through the opening 2163 of the covering member 216. After the gas is converged to the convergence chamber 217a, the gas is transferred to the first chamber 217b through the central aperture 2120 of the resonance plate 212. Due to the resonance effect of the suspension plate 2131 of the piezoelectric actuator 213, the resonance plate 212 is vibrated in a reciprocating manner. FIG. 7B shows that the resonance plate 212 is subjected to an upward deformation during reciprocate vibration. As shown, the portion of the resonance plate 212 around the central aperture 2120 is protruded upwardly.

Please refer to FIG. 7C. The piezoelectric actuator 213 is vibrating downwardly and has returned to its original position. Meanwhile, the bulge 2131e of the suspension plate 2131 of the piezoelectric actuator 213 is close to the portion of the resonance plate 212 around the central aperture 2120. Consequently, the gas in the gas pump 21 is transferred to the upper portion of the first chamber 217b and temporarily stored therein.

Please refer to FIG. 7D. The piezoelectric actuator 213 is further vibrating downwardly, while the resonance plate 212 is also vibrating downwardly caused by the resonance effect of the piezoelectric actuator 213. Due to the downward deformation of the resonance plate 212, the volume of the first chamber 217b is shrunken, and a pressure gradient therein is generated. Consequently, the gas in the upper portion of the first chamber 217b is pushed toward peripheral regions of the first chamber 217b, and transferred downwardly through the vacant space 2134 of the piezoelectric actuator 213, then blowing out under pressure through the central aperture 2120 of the resonance plate 212. The compressed gas flow is transferred to the guiding chamber 202 of the guiding carrier 20 through the introduction opening 204.

From the above discussions, it can be seen that when the resonance plate 212 is vibrating along the vertical direction in the reciprocating manner, the vertical displacement of the resonance plate 212, which is also the amplitude of vibration of the resonance plate 212, can be increased due to the gap g0 between the resonance plate 212 and the piezoelectric actuator 213. That is, the proper gap g0 between the resonance plate 212 and the piezoelectric actuator 213 allows the resonance plate 212 to reach its maximum amplitude when vibrating.

Finally, the resonance plate 212 returns to the original position as shown in FIG. 7A. The processes of FIGS. 7A to 7D are repeatedly done. Consequently, the gas is continuously introduced into the convergence chamber 217a through the opening 2163 of the covering member 216, and transferred to the first chamber 217b. Then, the gas is transferred from the first chamber 217b to the convergence chamber 217a, and continuously fed into the introduction opening 204. Consequently, the gas can be transferred steady. When the gas pump 21 is operated, the gas sequentially flows through the opening 2163 of the covering member 216, the convergence chamber 217a, the first chamber 217b, the convergence chamber 217a and the introduction opening 204. The gas pump 21 of the prevent invention takes advantage of the covering member 216 with the opening 2163 as one single component which covers the inner structure and allows the gas to flow in, so as to decrease the amount of the components and simplify the whole manufacturing process.

Please refer to FIG. 2B. As mentioned above, the operation of the gas pump 21 guides the gas into the first guiding chamber 201 of the guiding carrier 20, and transfers the gas to the second guiding chamber 203 through the communication structure 205, by which the heat from the electronic component 3 is continuously removed. Moreover, since the gas in the first guiding chamber 202 is continuously pushed to the second guiding chamber 203 through the communication structure 205, the gas in the second guiding chamber 203 is quickly moved, which facilitates discharge of the heated gas through the plural discharge grooves 206 to the exterior of the air-cooling heat dissipation device 2. Under this circumstance, the performance stability and the use life of the electronic component 3 are increased.

Figure 8:
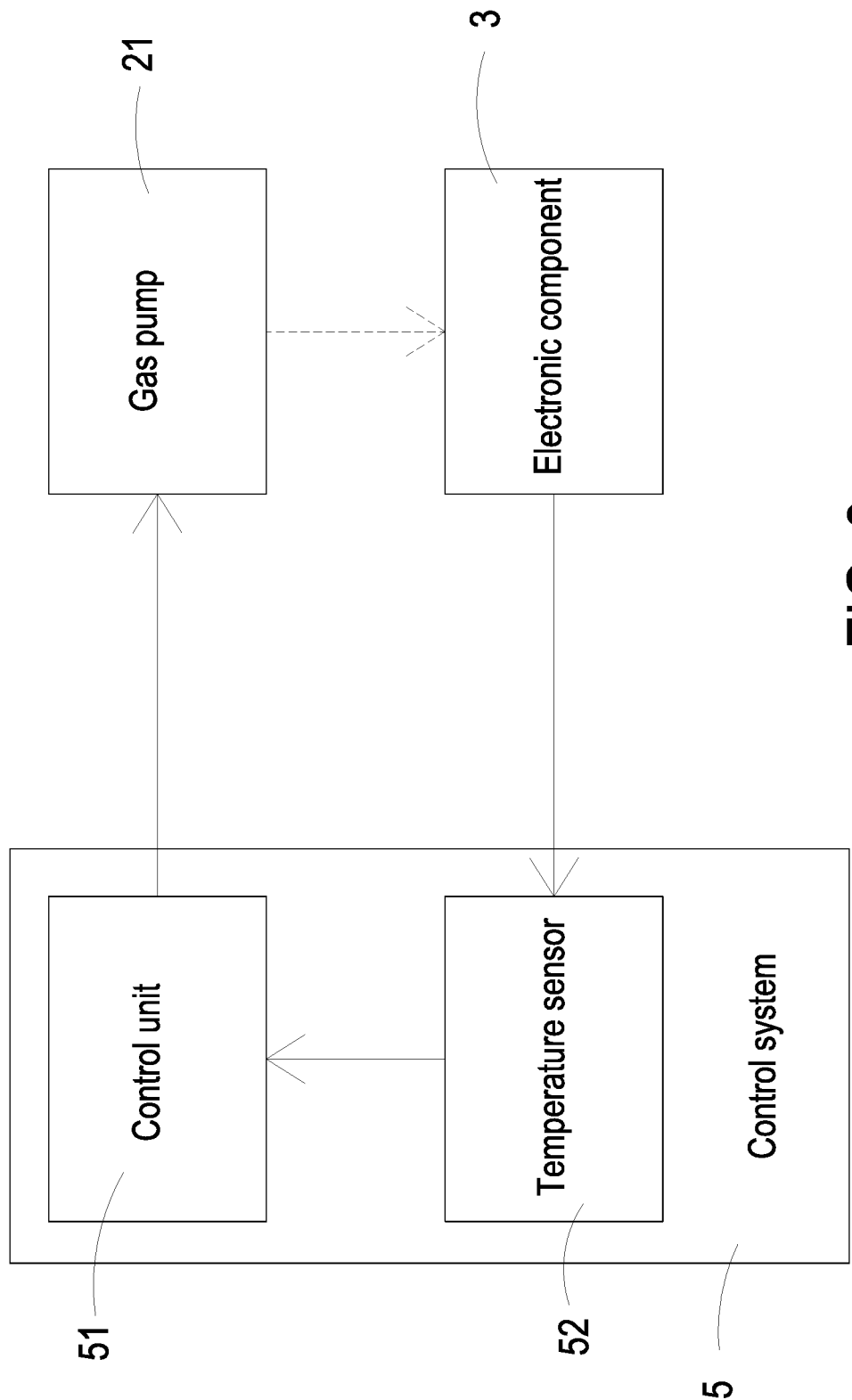
FIG. 8 is a schematic cross-sectional view illustrating the architecture of a control system of the air-cooling heat dissipation device according to the embodiment of the present invention.

FIG. 8 is a schematic cross-sectional view illustrating the architecture of a control system of the air-cooling heat dissipation device according to the embodiment of the present invention. Especially, the air-cooling heat dissipation device 2 further provides a temperature control function. In this embodiment, the air-cooling heat dissipation device 2 further comprises a control system 5. The control system 5 comprises a control unit 51 and a temperature sensor 52. The control unit 51 is electrically connected with the gas pump 21 to control the operation of the gas pump 21. In an embodiment, the temperature sensor 52 is disposed within the second guiding chamber 203 of the guiding carrier 20 and located near the electronic component 3 for sensing the temperature near the electronic component 3. Alternatively, the temperature sensor 52 is directly attached on the electronic component 3 for sensing the temperature of the electronic component 3. The temperature sensor 52 is electrically connected with the control unit 51. After detecting the temperature of the electronic component 3, the temperature sensor 52 accordingly transmits a detecting signal to the control unit 51. According to the detecting signal of the temperature sensor 52, the control unit 51 determines whether the temperature of the electronic component 3 is higher than or equal to a threshold value. If the control unit 51 determines that the temperature of the electronic component 3 is higher than or equal to the threshold value, the control unit 51 issues an enabling signal to the gas pump 21 to enable the gas pump 21. When the gas pump 21 is enabled, the gas is driven to cool the electronic component 3. Consequently, the heat of the electronic component 3 is dissipated away and the temperature of the electronic component 3 drops. Oppositely, if the control unit 51 determines that the temperature of the electronic component 3 is lower than the threshold value, the control unit 51 issues a disabling signal to the gas pump 21. Since the gas pump 21 is accordingly disabled, unnecessary operation of the gas pump 21 is prevented, thus prolonging the use life of the gas pump 21 and saving the power consumption. That is, in case that the temperature of the electronic component 3 is too high, the control system 5 enables the gas pump 21 to cool the electronic component 3; on the contrary, in case that the temperature of the electronic component 3 has been dropped to an acceptable level, the control system 5 disables the gas pump 21. Since the electronic component 3 is operating at a suitable temperature, the stability of performance of the electronic component 3 is increased.

The present invention provides an air-cooling heat dissipation device which can be applied to various electronic devices to remove heat from electronic components thereof through creating lateral convection. Consequently, the heat dissipating efficiency is enhanced, the noise is reduced, and the performance stability and the use life of the electronic component are increased. Moreover, since it is not necessary to attach a heat sink on the electronic component, the overall thickness of the electronic device is reduced. Furthermore, the air-cooling heat dissipation device also has a temperature control function. According to the temperature change of the electronic component, the operation of the gas pump is correspondingly controlled. Consequently, the heat dissipating efficiency is enhanced, and the use life of the air-cooling heat dissipation device is extended.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An air-cooling heat dissipation device for removing heat from an electronic component, the air-cooling heat dissipation device comprising:
a guiding carrier comprising a first surface, a second surface, a pump-receiving recess, a first guiding chamber, a second guiding chamber, an introduction opening, a communication structure and at least one discharge groove, wherein the first surface is a top surface of the guiding carrier, the second surface is a bottom surface of the guiding carrier, the pump-receiving recess is concavely formed in the first surface of the guiding carrier, the first guiding chamber is concavely formed in a bottom surface of the pump-receiving recess, the introduction opening is formed in the bottom surface of the pump-receiving recess, the introduction opening is in communication with the first guiding chamber, the second guiding chamber is concavely formed in the second surface, the communication structure is in communication between the first guiding chamber and the second guiding chamber, the at least one discharge groove is in communication between the second guiding chamber and surroundings of the air-cooling heat dissipation device, and the electronic component is disposed within the second guiding chamber;
a gas pump disposed within the pump-receiving recess of the guiding carrier and sealing the edge of the introduction opening, wherein the gas pump comprises a resonance plate, a piezoelectric actuator and a covering member, wherein the resonance plate has a central aperture, the piezoelectric actuator is aligned with the resonance plate, and the covering member comprises a sidewall, a bottom plate and an opening, wherein the sidewall is protruded from edges of the bottom plate, an accommodation space is defined by the sidewall and the bottom plate collaboratively, the resonance plate and the piezoelectric actuator are accommodated within the accommodation space, a first chamber is formed between the bottom plate of the covering member and the resonance plate, and a convergence chamber is formed between the resonance plate and the sidewall of the covering member,
wherein when the gas pump is enabled, an ambient gas is introduced into the first guiding chamber through the introduction opening and transferred to the second guiding chamber through the communication structure so as to exchange heat with the electronic component, after which the heated gas is discharged through the at least one discharge groove.

2. The air-cooling heat dissipation device according to claim 1, wherein the air-cooling heat dissipation device further comprises a supporting substrate, wherein the supporting substrate is contacted with the second surface of the guiding carrier, and the electronic component is disposed on the supporting substrate.

3. The air-cooling heat dissipation device according to claim 1, wherein the guiding carrier further comprises an introduction groove concavely formed in the first surface of the guiding carrier and in communication with the pump-receiving recess, and the ambient gas is introduced into the gas pump through the introduction groove.

4. The air-cooling heat dissipation device according to claim 1, wherein the communication structure comprises a collecting part and plural communication parts, wherein the collecting part is in communication with the first guiding chamber, the plural communication parts are in communication with the second guiding chamber, and the collecting part further comprises a slant surface corresponding to the plural communication parts.

5. The air-cooling heat dissipation device according to claim 4, wherein the collecting part further comprises a collecting part port in communication between the introduction opening and the collecting part, and an area of the collecting part port is larger than an area of the bottom of the collecting part.

6. The air-cooling heat dissipation device according to claim 1, wherein the covering member, the piezoelectric actuator and the resonance plate of the gas pump are stacked on each other sequentially, wherein when the piezoelectric actuator is actuated to perform a gas-collecting operation, the gas is transferred to the first chamber through the central aperture of the resonance plate, and temporarily stored in the first chamber, wherein when the piezoelectric actuator is actuated to perform a gas-releasing operation, the gas is transferred from the first chamber to the introduction opening through the central aperture of the resonance plate.

7. The air-cooling heat dissipation device according to claim 1, wherein the piezoelectric actuator comprises:
a suspension plate having a first surface and an opposing second surface;
an outer frame comprising at least one bracket, wherein the at least one bracket is connected between the suspension plate and the outer frame; and
a piezoelectric plate attached on the first surface of the suspension plate for driving curvy vibration of the suspension plate when being applied a voltage.

8. The air-cooling heat dissipation device according to claim 7, wherein a gap is formed between the resonance plate and the piezoelectric actuator.

9. The air-cooling heat dissipation device according to claim 7, wherein at least one vacant space is formed between the at least one bracket, the suspension plate and the outer frame, and two ends of the at least one bracket are respectively connected to the outer frame and the suspension plate.

10. The air-cooling heat dissipation device according to claim 7, wherein the suspension plate further comprises a bulge formed on the first surface thereof, and the bulge is a cylinder.

11. The air-cooling heat dissipation device according to claim 7, wherein the gas pump further comprises at least one insulation plate and a conducting plate, wherein the at least one insulation plate and the conducting plate are stacked on each other and located under the piezoelectric actuator.

12. The air-cooling heat dissipation device according to claim 11, wherein the outer frame of the piezoelectric actuator comprises a first conducting pin, the conducting plate comprises a second conducting pin, and the opening of the covering member is formed in the sidewall of the covering member in which the first conducting pin and the second conducting pin are protruding out of the opening of the covering member so as to be electrically connected with an external circuit.

13. The air-cooling heat dissipation device according to claim 1, further comprising a control system, wherein the control system comprises:

a control unit electrically connected with the gas pump for controlling operations of the gas pump; and a temperature sensor electrically connected with the control unit and located near the electronic component, wherein the temperature sensor detects a temperature of the electronic component and generates a corresponding detecting signal to the control unit, wherein the control unit obtains the temperature of the electronic component according to the detecting signal, wherein if the control unit determines the temperature of the electronic component is higher than or equal to a threshold value, the control unit enables the gas pump to drive the gas to flow, wherein if the control unit determines the temperature of the electronic component is lower than the threshold value, the control unit disables the gas pump.

* * * * *